United States Patent [19]

Knauer et al.

[11] Patent Number: 4,560,878

[45] Date of Patent: Dec. 24, 1985

[54] ELECTRON AND ION BEAM-SHAPING APPARATUS

[75] Inventors: Wolfgang Knauer, Malibu; Walter E. Perkins, Jr., Redding, both of Calif.

[73] Assignee: Hughes Aircraft Company, El Segundo, Calif.

[21] Appl. No.: 525,199

[22] Filed: Aug. 22, 1983

Related U.S. Application Data

[63] Continuation-in-part of Ser. No. 440,481, Nov. 9, 1982, abandoned, which is a continuation of Ser. No. 151,030, May 19, 1980, abandoned.

[51] Int. Cl.[4] .................... H01J 37/302; H01J 37/147
[52] U.S. Cl. ............................... 250/396 R; 250/398; 250/492.2
[58] Field of Search ............ 250/492.2, 398, 396 ML, 250/396 R

[56] References Cited

U.S. PATENT DOCUMENTS 4,218,621 8/1980 Nakasuji et al. ................ 250/492.2

FOREIGN PATENT DOCUMENTS 54-127682 10/1979 Japan .

OTHER PUBLICATIONS

Pfeiffer et al., "Advanced Beam Shaping . . . ", *8th Int. Conf. Electron and Ion Beam Science and Technology*, 1978, pp. 149-159.

*Primary Examiner*—Bruce C. Anderson
*Assistant Examiner*—Jack I. Berman
*Attorney, Agent, or Firm*—John A. Sarjeant; A. W. Karambelas

[57] ABSTRACT

Electron or ion beam shaping apparatus has first aperture (28) and second aperture (30) through which the beam (20) is focused by first lens (24). Double deflection apparatus of either electromagnetic or electrostatic character is small and can be positioned between the aperture plates so that the image of both apertures can be focused on the target (16). Double deflection serves to vary spot size and shape and assures that target current density does not change while spot size is varied.

15 Claims, 12 Drawing Figures

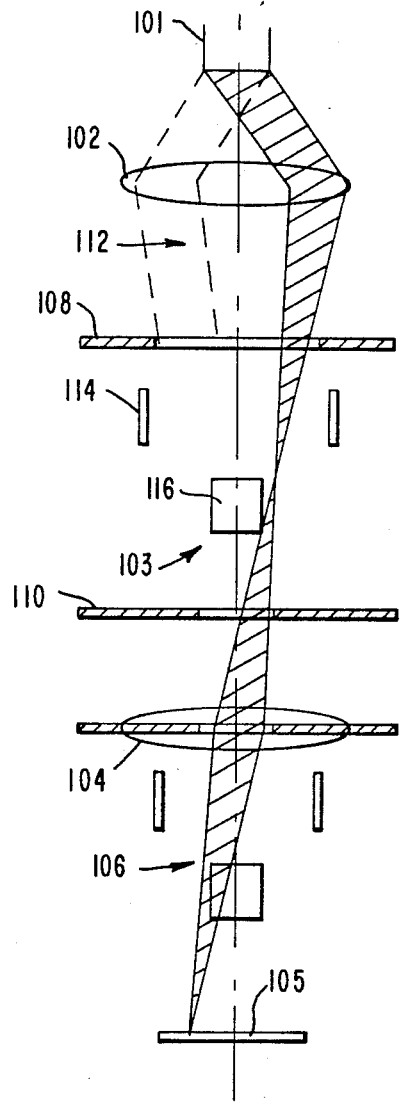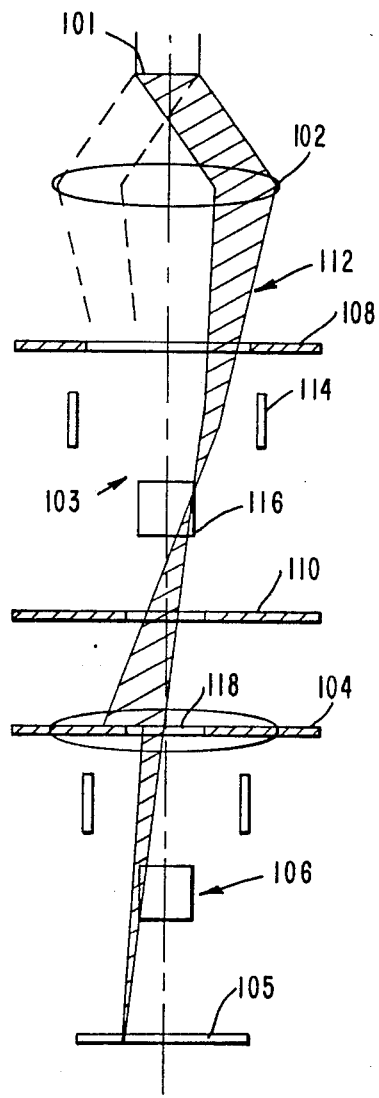

ELECTRON AND ION BEAM-SHAPING APPARATUS

CROSS REFERENCE

This application is a continuation in part of patent application Ser. No. 440,481, filed Nov. 9, 1982, now abandoned, which in turn was a continuation of patent application Ser. No. 151,030, filed May 19, 1980, now abandoned.

BACKGROUND OF THE INVENTION

This invention is directed to an apparatus for shaping an electron or ion beam, particularly for shaping the cross section of a focused electron or ion beam for lithographic exposure and the like. The apparatus provides a selection of sizes and shapes of the focused beam spot on the target.

Electron and ion beams are used to expose photolithographic sensitive resist material on a semiconductor wafer so that after removal of the nonmasking portions of the resist, the wafer can be doped, usually by ion implantation. As beam spot resolution improves, finer lines can be drawn, with closer spacing but such small spots require considerable time to expose large areas. The writing speed of conventional electron beam lithography systems, in which the demagnified image of a thermionic electron source serves as the writing spot, is often inadequate for submicron circuit fabrication purposes.

An alternative approach to submicron electron and ion beam lithography is to use shaped spots. Several investigators have shown that variable shaped spots with good edge resolution can increase the writing speed potential dramatically as outlined in the following papers: M. G. R. Thomson, R. J. Collier, and D. R. Herriott, *Journal of Vacuum Science Technology* 15, 891 (1978); and H. C. Pfeiffer, *Journal of Vacuum Science Technology* 15, 887 (1978). In fact, for minimum feature sizes of 1–2 microns, this approach has been proven in an actual production environment (see: G. J. Guiffre, J. F. Marquis, H. C. Pfeiffer, W. Stickel, 15th Symposium on Electron, Ion and Photon Beam Technology, Boston (1979).

A drawback of some spot-shaping methods is the complexity of their electron-optics. As described by M. G. R. Thomson, et al and H. C. Pfeiffer, supra, spot-shaping columns with aperture-to-aperture imaging consist of 5 or 6 lenses and 2 to 4 sets of beam alignment coils. Two of the lenses provide variable aperture imaging, while the remaining lenses serve to demagnify and project the shaped spot onto the target plane. Alignment coils are required since misalignment results in loss of the beam, as compared to Gaussian systems where beam misalignment only results in spot displacement.

A drawback of other spot-shaping methods is vignetting. In systems with aperture-to-aperture shadow casting, the beam does not return to the center of the final lens and, therefore, the spot current density varies as spot size is changed. This type of vignetting is seen in Hidekazu Gotou, Japanese, Pat. No. 127,682.

Therefore, there is need for a beam system which provides for shaped aperture exposure of resist, with the apparatus being simple in configuration so that it can be readily and economically mechanized and controlled and is without vignetting such that the spot current density remains independent of spot size.

SUMMARY OF THE INVENTION

In order to aid in the understanding of this invention, it can be stated in essentially summary form that it is directed to a beam shaping apparatus which employs a source which provides electrons of ions and a first lens which serves as a condenser and illuminates the first and second serial apertures. The focal length of the condenser projects a magnified image of the virtual source onto the aperture of the final lens. The beam leaving the first aperture is doubly deflected by a double deflector between the apertures so that a selected image shape can be projected onto the target. The first deflector provides variable shadowing of the second aperture, and the second deflector steers the beam back towards the axis.

It is thus a purpose and advantage of this invention to provide a focused beam apparatus which employs a charged particle source and, through a simple optical system, projects shaped spots onto a target. It is another purpose and advantage to provide a focused beam apparatus which provides spot-shaping capability with only three lenses.

It is another purpose and advantage to provide a focused beam apparatus to increase the writing speed of particle beam resist exposure systems by writing small pattern elements with small spots and coarse pattern elements with larger spots. It is a further purpose and advantage to provide a focused beam apparatus wherein the beam is laterally deflected adjacent to two closely spaced apertures so that the first aperture directly shadows the second aperture.

It is a further purpose and advantage to provide such an apparatus wherein the beam is deflected by a first and a second deflector, in conjunction with two apertures which are made to optically overlap along the optical path, said first deflector varying the spot shape and said second deflector directing the beam back through the center of the final lens to avoid vignetting.

It is another purpose and advantage to coordinate the deflection angles of both deflectors, such that deflection occurs in opposite directions and that the magnitude of deflection is linearly coupled whereby the deflection angle of the second deflector always is slightly larger than the angle of the first deflector. It is another purpose and advantage to provide such an apparatus wherein the two apertures are placed so close together that the first shadows the other and that both are imaged with sufficient sharpness onto the target plane.

It is a further purpose and advantage to provide a compact double deflection system mounted between, rather than outside of both apertures to avoid variations in aperture illumination and movement of the spot in the target plane while the spot shape is varied.

Other purposes and advantages of this invention will become apparent from a study of the following portion of this specification, the claims and the attached drawings.

BRIEF DESCRIPTION OF THE DRAWINGS

FIG. 11 is a raytrace of the beam optical structure of a prior art apparatus, shown in the nondeflected position.

FIG. 12 is similar to FIG. 11, showing the beam deflected for the purpose of beam shaping, and showing the manner in which vignetting occurs in the final lens.

DETAILED DESCRIPTION OF THE INVENTION

Figure 1:
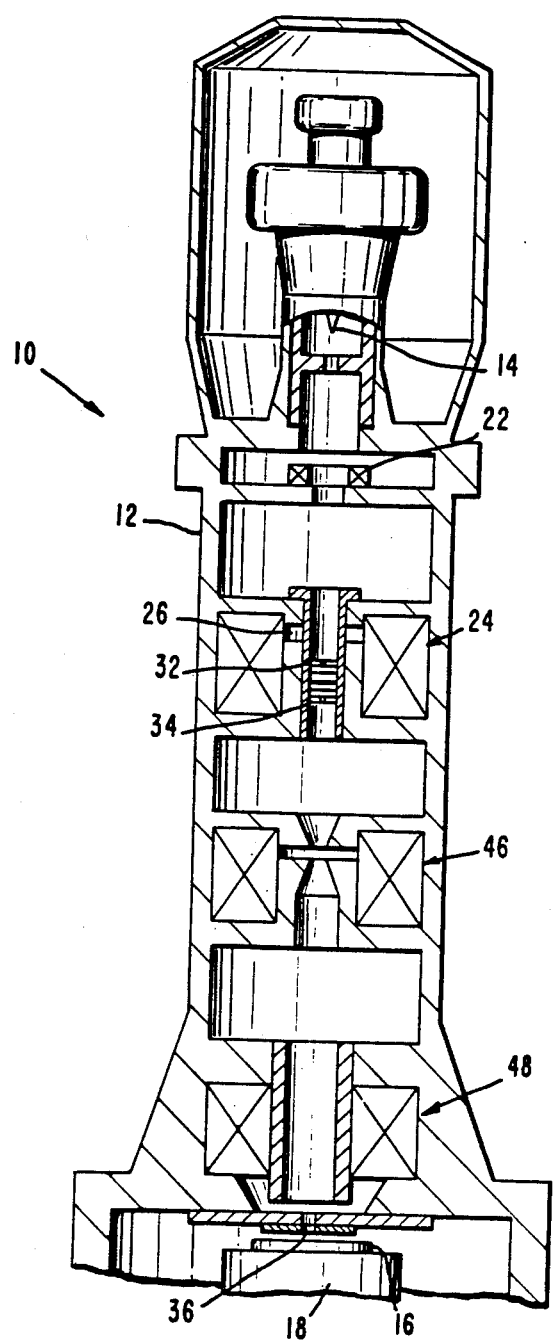
FIG. 1 is a generally central longitudinal section through a beam exposure column having the beam shaping apparatus in accordance with this invention.

For electrons, the beam apparatus of this invention is generally indicated at 10 in FIG. 1. The apparatus includes a housing 12 within which a sufficient vacuum is drawn to permit beam management. Hot filament electron source 14 is a tungsten hairpin filament which is biased with respect to target wafer 16 on target stage 18 at 20 kilovolts so that the tungsten hairpin filament source generates a beam with a brightness of about $3.10^5$ amperes per square centimeter and steradian, and with a virtual source diameter at crossover of approximately 50 microns. The electron beam is indicated at 20 in FIGS. 3 through 6. Magnetic beam alignment coils 22 are on the beam path, which is central down the axis of FIG. 1, as it passes to first lens 24. The first lens 24 is a magnetic lens with a magnetic gap 26. The first lens serves as a condenser which illuminates the spot shaper apparatus 25 which includes the two square apertures 28 and 30, respectively, in aperture plates 32 and 34. The distance between the source and the apertures and the size of the apertures is chosen such that only the uniformly bright core of the beam at about $10^{-3}$ rad can pass through both apertures. The focal length of the condenser lens 24 is adjusted to project through focal plane 47, a magnified image of the virtual source through aperture 36, which is the aperture in final demagnifying third lens 48. The round aperture 36 in final lens 48 serves to limit aberrations to well below 0.1 micron and to select spot forming rays from a well defined center region of the crossover at the aperture plane. This assures that small alignment changes do not affect the uniformity of spot illumination.

Figure 2:
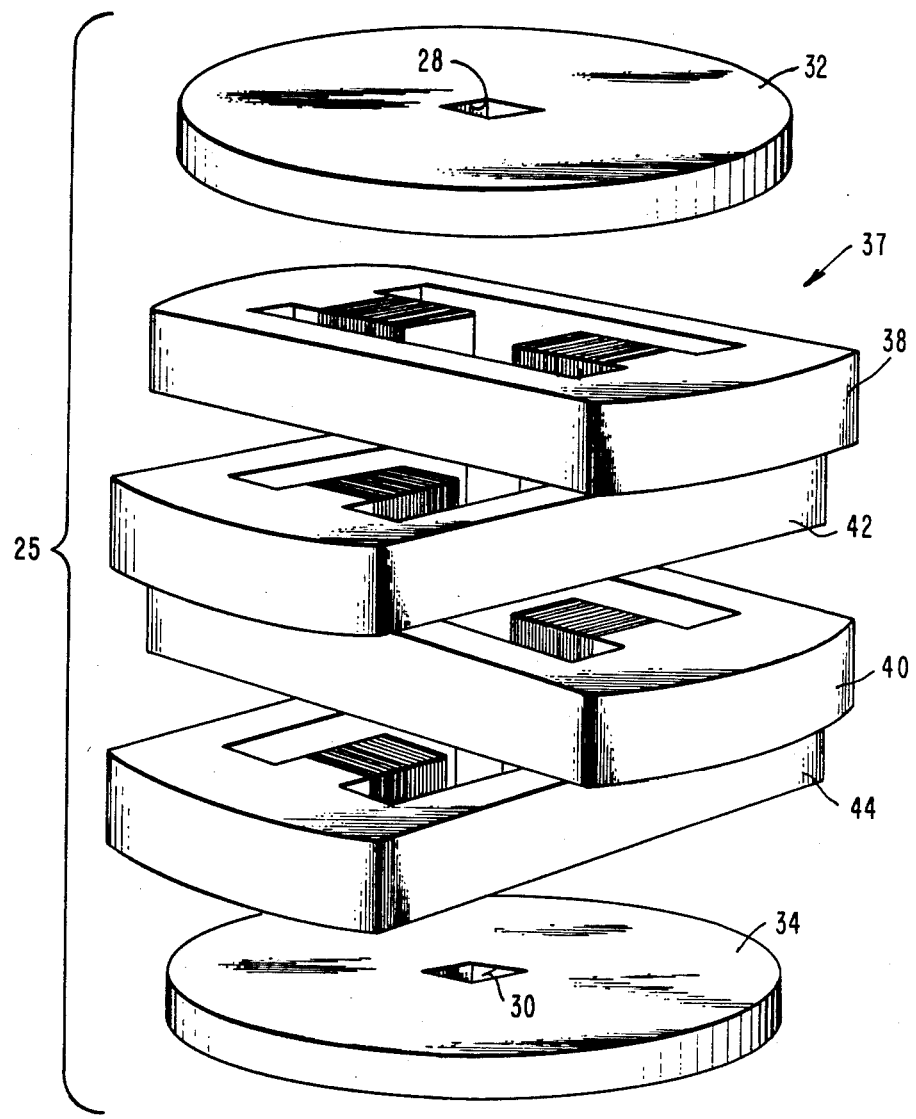
FIG. 2 is an enlarged perspective view of the apertures and deflection yokes of the apparatus of FIG. 1.
Figure 3:
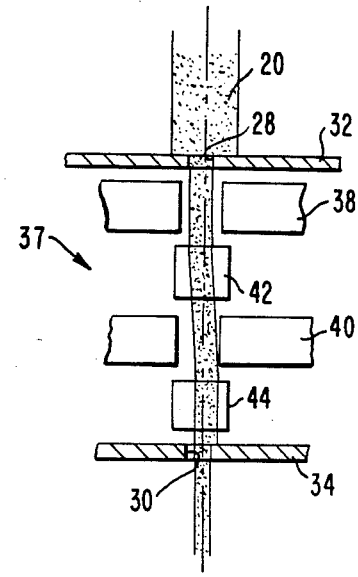
FIG. 3 is an enlarged detailed view of the beam passing through the apertures, shown as a centerline section.

The square beam passing the first square aperture 28 is deflected by a ferrite core double deflector 37, see FIGS. 2 and 3. Ferrite cores 38 and 40 serve to deflect the beam laterally within the plane of the paper in FIG. 3 with the first core 38 providing lateral beam deflection and the second core 40 returning the beam path to a direction essentially parallel to the center line. Similarly, ferrite cores 42 and 44 serve as an electron beam double deflection pair to deflect the beam in a direction normal to the paper in FIG. 3, with the resultant beam being essentially parallel to and displaced laterally from the original beam path. The redirected beam is guided through the center of final lens 48 to minimize aberration in the demagnification. Depending upon the degree of deflection, a larger or a smaller portion of the square beam from the first aperture passes through the second aperture. The resulting variable shaped beam is demagnified by the second and third lenses 46 and 48 and imaged onto target 16 on the target plane. Since the two shaping apertures 28 and 30 are located at different distances from the target plane, both cannot be imaged sharply at the same time. An intermediate focusing plane must be chosen, which leads to some edge blurring. The aperture edges are imaged as if they were diffused lines of about two micron width. In the target plane, where a 100:1 demagnified image is created, edge blurring amounts to about 100 angstroms. This is well below the edge resolution desired in most applications. Deflection aberrations associated with the dual deflection are even smaller since beam aperture and beam deflection angles are small.

Figure 4:
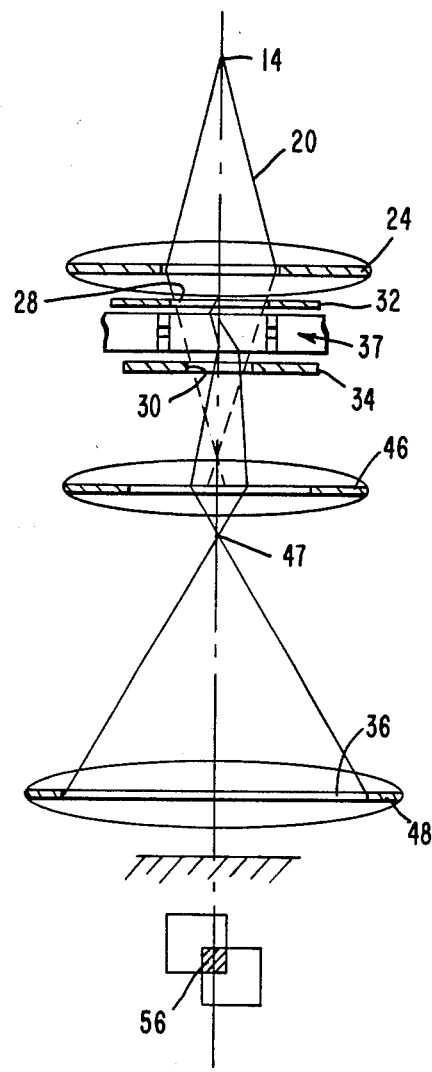
FIG. 4 is a raytrace of the beam optical structure of the apparatus, with the angular divergence of the beam exaggerated and symbolically showing the lenses as visible optics lenses.

FIG. 4 shows a raytrace produced by the optical structure, with the lenses 24, 46 and 48 symbolically shown as visible optical lenses, and the area electron source 14 illustrated as a point source. Illumination rays from the source are indicated by dashed lines between the plates 32,34 and the demagnifying lens 46, while imaging rays are indicated by solid ray traces. As shown in the figure, the beam is focused by condenser lens 24 to an illumination crossover at the upper edge of demagnifying lens 46.

Figure 5:
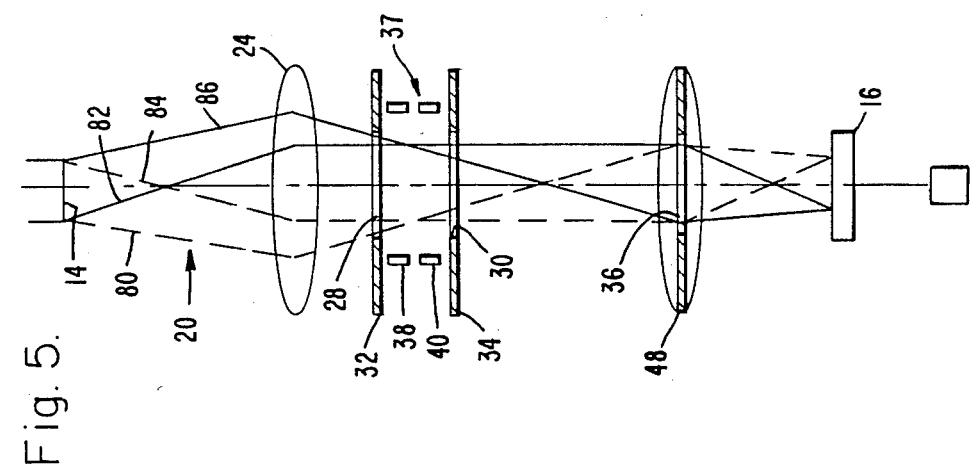
FIG. 5 is a raytrace similar to FIG. 4 but showing the aperture section as schematically enlarged, showing the beam flooding the upper aperture and further beam shaping. The demagnification lens have been omitted for clarity.
Figure 6:
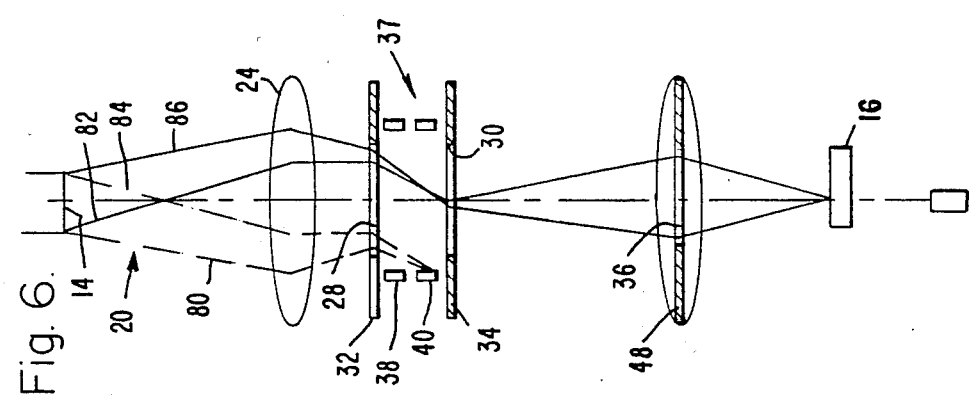
FIG. 6 is a view similar to FIG. 5 showing the beam deflected a small amount between the apertures for beam shaping.
Figure 7:
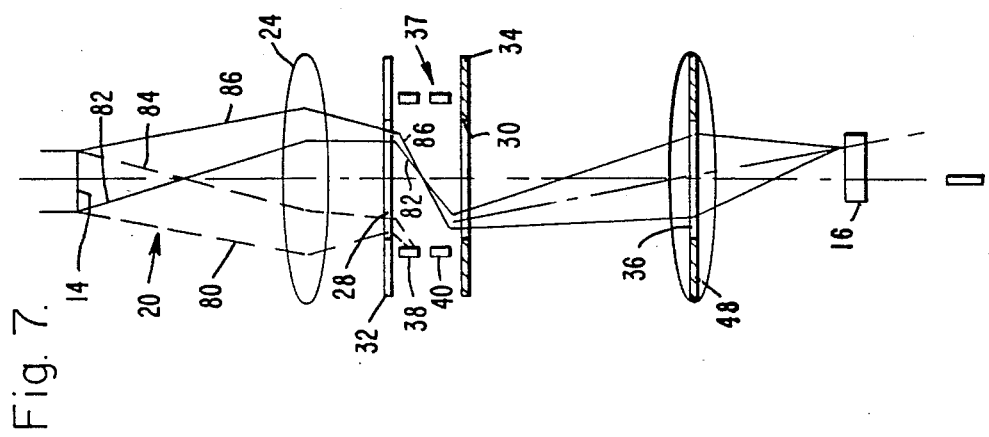
FIG. 7 is a view similar to FIG. 6 showing the beam fully deflected between the apertures for maximum beam shaping.

FIGS. 5–7 are simplified raytraces in which the demagnification lens 46 is not shown.

FIG. 5 shows the raytrace path of beam 20 in a position where the beam is not deflected for beam shaping. FIG. 6 shows the raytrace of beam 20 in a position where the beam 20 is moderately deflected for moderate beam shaping. FIG. 7 shows the raytrace of beam 20 where it is the subject of maximum deflection for maximum beam shaping. Source 14 is a radiant source where each point on the source 14 emits in a hemispherical pattern. For understanding the beam 20 and its deflection, four particular rays are traced through the column. Ray 80 is a selected ray which is emitted from the left corner of source 14 and passes through the left side of the optics. Ray 82 is a ray which is emitted at the left corner of the source 14 and passes through the right side of the optics of the column. Ray 84 is a ray which is emitted from the right corner of source 14 and passes through the left side of the optics. Ray 86 is emitted from the right corner of source 14 and passes through the right side of the optics. In FIG. 5, there is no deflection by deflector 37 between the aperture plates 32 and 34. Thus, the rays flood aperture 28 to produce a beam below aperture 28 corresponding to the configuration of that aperture. As shown in FIG. 2, aperture 28 is square so that the beam below that point, until further shaped, is square. As previously described, the beam 20 is demagnified to project a full size square spot on target 16.

FIG. 6 illustrates the double deflector 37 as being energized to move the beam to the left at the lower aperture plate 34 with its aperture 30 so that some of the beam which passes through the aperture 28 in the upper plate is intercepted and cutoff of the beam. In FIG. 6, the double deflector plates deflect the beam to the left. The deflected left ray 82 and right ray 86 are shifted halfway across the opening in plate 34. Thus, the resultant beam out of plate 30 appears like the spot 50 of the beam in FIG. 8. Notice that the beam is undeflected at the aperture plate 32 and coming out of the aperture plate 34, the beam is directed to the center of lens 48. FIG. 7 shows the beam more deflected by the double deflector 37, to maximum beam shaping in the lateral direction. In FIG. 7 left ray 82 and right ray 86 are sufficiently deflected that they are shifted nearly completely across the opening in plate 34. As a result, only a narrow slice of the beam passes through the aperture 30 and is directed onto the target 16 to produce a narrow rectangular spot.

The double deflection of the beam 20 in deflector 37 redirects the beam through the center of lens 48 so that it passes through its aperture 36. In this way, no vignetting of the beam occurs due to the beam being partly obstructed by at least partly missing aperture 36. The spot brightness is the same for all spot shapes. In addition, passing through the center of lens 48 minimizes the aberrations which would be caused in the beam by passing through the demagnifying lens 48 on a line other than the center line.

Both FIGS. 6 and 7 show substantial angles achieved in deflector 37. These large angles are shown for purpose of illustration. In actuality, the total deflections are about 1° at the most, and the sizes of the apertures and the geometry is such that those small deflection angles can achieve the proper masking. Furthermore, it must be noted that the deflection of the second core 40 is larger than the deflection of the first core 30, in order to redirect the beam back to the center of lens 48. In addition, the amount of redeflection is proportionately larger than the amount of the initial deflection. For example, if the initial deflection by deflector 30 is the angle A, then the amount of redeflection by the second deflector 40 is A+kA, where k is a small fractional constant, for example, 0.1. In this example, if the initial deflection by deflector 30 is 1°, then the redeflection is 1.1°. As a further example, if the initial deflection is 2°, then the redeflection is 2.2°. These are the kinds of numbers which can be achieved, but are dependent upon the geometrics of the system to achieve the desired beam shaping.

This is to be contrasted to the prior art as represented by Gotou, Japanese Pat. No. 127,682, schematically illustrated in FIGS. 11 and 12. In FIGS. 11 and 12, source 101 provides an electron beam which is focused by condenser lens 102 through a system 103 which controls the cross-section of the beam. The projection lens 104 demagnifies the beam and projects it onto target 105. Writing deflection plates 106 control the beam to write on target 105.

The cross-sectional shape varying means includes a first mask 108 and a second mask 110, each having a suitable aperture. Beam 112 floods the aperture in plate 108, and deflection plates deflect the beam with respect to the aperture in the second plate 110. A first pair 114 of deflection plates deflect the beam on X coordinates and a second pair 116 deflect the beam on Y coordinates. In FIG. 11, the beam is centered, without cross-sectional control by shape varying means 103 and without steering by deflection plates 106. In FIG. 12, the beam 112 is deflected by shape control deflection plates 114. A portion of the beam 112 is cut off by not passing the aperture in second mask 110, but there is no redeflection so that a considerable portion of the remainder of the beam is not passed by the aperture 118 in the final lens 104. Thus, vignetting occurs, and the beam which is passed to the target, while of the desired beam shape, does have a reduced current density. A considerable amount of the beam current is lost in the final lens through vignetting because the beam is not redirected toward the center of the final lens 104. In actual spot-shaping systems of this kind, the loss of beam current is so severe that the spot can be reduced in width less than 20% before the current density has dropped to zero. In FIG. 12, the writing deflection plates 106 are shown as not energized, but the deflection of the final beam from the center line is the result of failure to redirect the initial beam.

Figure 8:
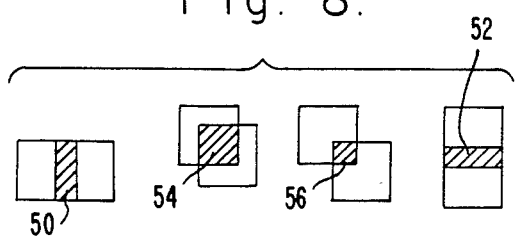
FIG. 8 shows a selection of some of the spot shapes available with square apertures.

FIG. 8 shows spot 50 which is achieved by only lateral deflection by cores 38 and 40 while spot 52 shows spot configuration obtainable by double deflection by cores 42 and 44. Spots 50 and 52 are rectangular. Spots 54 and 56 are different size squares obtainable by different amounts of deflection by both sets of ferrite cores. Of course, a full size square is also available as a selected spot, and is accomplished without deflection. Small rectangles are also available by selective deflection.

Figure 9:
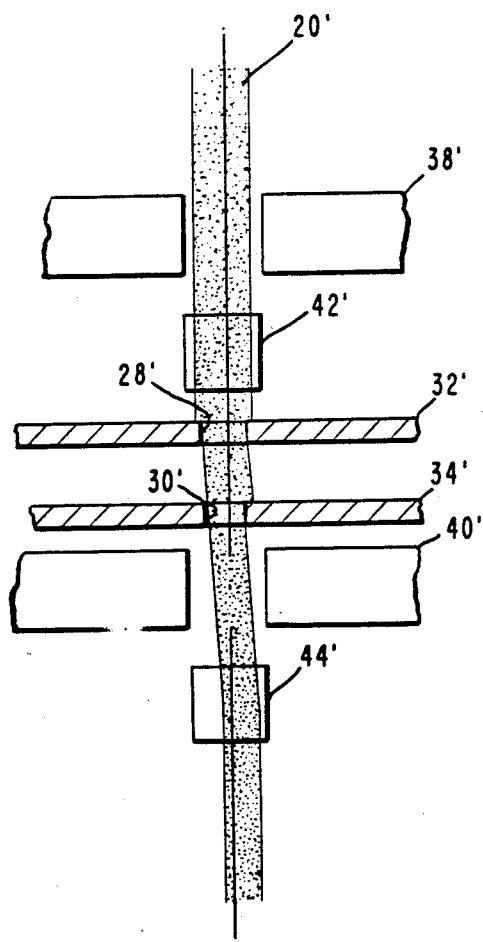
FIG. 9 is an enlarged detailed view similar to FIG. 3 of another preferred embodiment, shown as a centerline section with parts broken away.

FIG. 9 shows a structure similar to the first preferred embodiment of FIGS. 1–5. In the spot shaper apparatus in the electron beam apparatus of FIG. 9, the two apertures 28' and 30' are placed between the deflection yokes. This permits a closer focus but the larger deflection angle brings other aberrations which prevent a better image definition. The parts in FIG. 9 which are similar to FIG. 3 are shown identified with the same numbers with a prime.

Figure 10:
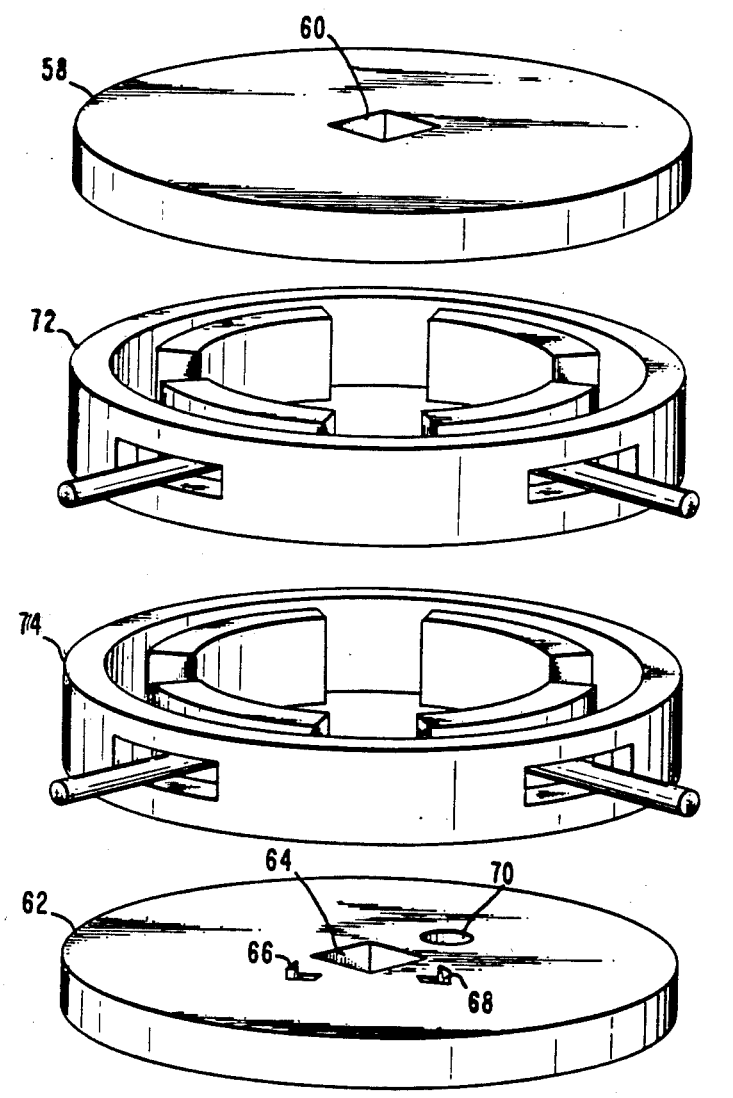
FIG. 10 is a perspective view of another preferred embodiment of the electron beam shaping apparatus wherein electrostatic deflection is employed for beam double deflection and a spot is selectable from a plurality of nonrectangular pattern shapes.

FIG. 10 illustrates another preferred embodiment of aperture plates and double deflection structures which can be directly substituted for the aperture plates and ferrite core deflectors thus far described. Aperture plate 58 has a square aperture 60, the same as aperture plate 32. Lower aperture plate 62 has a square aperture 64, the same as aperture plate 34, but also has other shaped apertures adjacent the central aperture 64. The other shaped apertures are chevron shaped apertures 66 and 68 and circular aperture 70. Double deflection of the beam is accomplished between the aperture plates by electrostatic deflection plates in deflection plate holders 72 and 74. Each of the deflection plate holders has four orthogonally positioned electrostatic deflection plates which arrange to double deflect the beam in either of the two orthogonal planes. When a small amount of deflection is provided, the spot shapes available are the same as in FIG. 8. When the larger deflection is employed, then one of the chevrons or the circle acts as the lower aperture so that whole or partial chevrons or chords of the circular aperture 70 are available as the exposure spot. From lower aperture plate 62, the beam is directed back to the center of final lens 48.

In view of the fact that all of the electron optical components used in shaping and varying the shape of the spot are combined in a single compact unit, this structure provides for a compact electron beam apparatus suited for high speed submicron lithography.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A beam-shaping apparatus for shaping an electron or ion beam and directing it onto a target plane, comprising:
   a beam source for producing a substantially collimated electron or ion beam substantially along a center line,
   first and second closely spaced plates positioned along the center line, the plates including mutually aligned shaped apertures for shaping a beam passing through the apertures,
   a final lens positioned along the center line between the plates and the target plane, the final lens being adapted to focus an incident beam onto the target plane,
   beam projection means responsive to a beam from the beam source for projecting the beam onto the final lens through the plate apertures, and
   first and second deflection means positioned between the plates for deflecting the beam so that the beam passing out of the second aperture is shaped by the edges of the first and second apertures, the first and second deflection means being mutually spaced in the direction of the center line, the first deflection means imparting an initial deflection to the beam and the second deflection means directing the beam substantially back to the center line at the final lens to substantially eliminate vignetting and beam aberration due to the beam being projected onto the final lens off-center.

2. The beam-shaping apparatus of claim 1, wherein the projecting means comprises a first lens positioned between the source and aperture plates for focusing the beam to a crossover between the aperture plates and the final lens, and a demagnifying lens positioned between the aperture plates and final lens in the vicinity of the beam crossover for projecting the beam onto the final lens.

3. The beam-shaping apparatus of claim 1, wherein the final lens includes a centered aperture, and the projecting means projects the beam onto the final lens substantially within said aperture.

4. The beam-shaping apparatus of claim 1, wherein the only beam focusing means are provided outside of the aperture plates.

5. The beam-shaping apparatus of claim 1, wherein said beam source comprises an electron source which provides substantially uniform illumination of said first and second apertures when the beam is not deflected between the aperture plates.

6. The beam-shaping apparatus of claim 1, wherein said beam source comprises an ion source which provides substantially uniform illumination of said first and second apertures when the beam is not deflected between the aperture plates.

7. The beam-shaping apparatus of claim 1, wherein said first and second deflection means comprise electromagnet deflection cores.

8. The beam-shaping apparatus of claim 1, wherein said first and second deflection means comprise electrostatic double deflection plates for orthogonal deflection of an electron beam.

9. The beam-shaping apparatus of claim 1, wherein said first and second aperture plates are spaced so close together that their apertures are imaged onto the target plane without any lens between the plates.

10. A beam-shaping apparatus for shaping an electron or ion beam and directing it onto a target plane, comprising:
    a beam source for producing a substantially collimated electron or ion beam substantially along a center line,
    first and second closely spaced plates positioned along the center line, the plates including mutually aligned shaped apertures for shaping a beam passing through the apertures,
    a final lens positioned along the center line between the plates and the target plane, the final lens being adapted to focus an incident beam onto the target plane and including a central aperture,
    a first lens positioned between the source and aperture plates for focusing the beams to a crossover between the aperture plates and the final lens,
    a demagnifying lens positioned between the aperture plate and the final lens in the vicinity of the beam crossover where the beam diameter is relatively small, for projecting the beam onto the final lens,
    first and second deflection means positioned between the aperture plates for deflecting the beam so that the beam passing out of the second aperture is shaped by the edges of the first and second apertures, the first and second deflection means being mutually spaced in the direction of the center line, the first deflection means imparting an initial deflection to the beam and the second deflection means directing the beam substantially back to the center line at the final lens substantially within the final lens aperture to substantially eliminate vignetting and beam aberration due to the beam being projected onto the final lens off-center,
    the demagnifying lens being positioned such that the area of an off-center beam at the demagnifying lens is small enough to avoid substantial aberrations therefrom, and
    the aperture plates being sufficiently close together that their apertures are imaged onto the target plane without any lens between the plates.

11. The beam-shaping apparatus of claim 10, wherein the first deflection means deflects the beam by an angle A and the second deflection means deflects the beam by an angle $A + kA$, wherein k is a constant smaller than 1.

12. The beam-shaping apparatus of claim 10, wherein said beam source comprises an electron source which provides substantially uniform illumination of said first and second apertures when the beam is not deflected between the aperture plates.

13. The beam-shaping apparatus of claim 10, wherein said beam source comprises an ion source which provides substantially uniform illumination of said first and second apertures when the beam is not deflected between the aperture plates.

14. The beam-shaping apparatus of claim 10, wherein said first and second deflection means comprise electromagnetic deflection cores.

15. The beam-shaping apparatus of claim 10, wherein said first and second deflection means comprise electrostatic double deflection plates for orthogonal deflection of an electron beam.

* * * * *